United States Patent
Shun'ko

(10) Patent No.: US 6,707,051 B2
(45) Date of Patent: Mar. 16, 2004

(54) RF LOADED LINE TYPE CAPACITIVE PLASMA SOURCE FOR BROAD RANGE OF OPERATING GAS PRESSURE

(75) Inventor: Evgeny V. Shun'ko, Ypsilanti, MI (US)

(73) Assignee: Wintek Corporation, Taichung (TW)

( * ) Notice: Subject to any disclaimer, the term of this patent is extended or adjusted under 35 U.S.C. 154(b) by 23 days.

(21) Appl. No.: 10/192,329

(22) Filed: Jul. 10, 2002

(65) Prior Publication Data

US 2004/0012319 A1 Jan. 22, 2004

(51) Int. Cl.[7] .............................. H01J 49/10; H01J 3/04
(52) U.S. Cl. ................. 250/492.1; 250/492.2; 250/423 R; 250/425; 313/359.1; 313/362.1; 315/111.21; 315/111.81
(58) Field of Search .................. 250/492.1, 492.2, 250/423 R, 425; 313/359.1, 362.1; 315/111.21, 111.81

(56) References Cited

U.S. PATENT DOCUMENTS 5,855,745 A * 1/1999 Manley .................. 204/192.12
6,392,187 B1 * 5/2002 Johnson .................. 219/121.43

* cited by examiner

Primary Examiner—Nikita Wells
(74) Attorney, Agent, or Firm—Carothers and Carothers

(57) ABSTRACT

An RF loaded line type CCP source-having two collar type electrodes with an operating tube passing through these electrodes. One of the electrodes (high voltage electrode) is connected with the core of a feeding coaxial cable leading to a power supply, and another one is grounded by connection to a braid of the feeding coaxial cable, and the grounded electrode is further extended to form an outer cylindrical shield enveloping the operating tube with the high voltage electrode to provide a termination of an RF loaded line wherein the high voltage electrode with a plasma beam excited within the operating tube by action of an electric field between the electrodes form a core of this RF line. To provide effective contribution of RF energy in the plasma beam, the impedance of this line can be matched to the impedance of the plasma beam and matched also to the impedance of the feeding cable.

14 Claims, 9 Drawing Sheets

RF LOADED LINE TYPE CAPACITIVE PLASMA SOURCE FOR BROAD RANGE OF OPERATING GAS PRESSURE

FIELD OF INVENTION

The present invention relates to a plasma processing technology, in particular to an RF capacitively coupled plasma source with a broad range of operating gas pressure, specifically close to or more than atmospheric pressure.

BACKGROUND OF THE INVENTION

Presently, the fields of technological application of plasma sources are growing rapidly, in particular in the manufacture of high tech devices for cleaning, etching, deposition, etc., in the semiconductor and micro-machine industries.

There exists many different types of plasma sources which assume different methods of plasma excitation in operating volumes of plasma devices. Within this variety, there is a separate group of capacitively coupled plasma sources in which the electromagnetic fields, with frequencies in the range of from a few MHz to tens of MHz (RF frequencies), are applied to plasma operating as one of the electrodes of an imaginary electric capacitor.

RF capacitively coupled plasma sources (hereinafter referred to as RF CCP sources) have wide application in plasma processing technologies. The present invention relates specifically to the RF CCP sources mentioned. Typical RF CCP sources of late generation are described in "Industrial Plasma Engineering", Vol. 1, Principles, J. Reece Roth, Institute of Physics Publishing, 1995, p.p. 417–463. As shown in FIG. 12.12, page 443 of this book (see FIG. 1 of the present disclosure), a plasma source with outer ring electrodes 2 and 3 mounted outside of glass wall tube 1 serving as the working chamber, is one of the possible RF CCP sources. This arrangement of the electrodes enables one to avoid a plasma contamination with the electrode material. The operating gas required for such a process could be fed to one of the ends of the tube 1 under required pressure, whereby, at the supply of RF power to said electrodes 1 and 2 at a frequency of 1 to 100 MHz, plasma 4 generated inside the tube 1 is pressed by the electromagnetic field out of the inter-electrode space to contact with work-piece 5 installed at one of the tube ends (or at both ends of the tube 1).

However practical operation of the type of RF CCP source shown in FIG. 1 leads to significant radiation of the RF power from the source by the symmetrically placed electrodes 1 and 2 and especially by a combined electrode-plasma system forming a typical dipole antenna. The RF power applied to the electrodes 1 and 2 presses plasma from the inter-electrode space to both the ends of the tube 1. Therefore in the case where only one of the tube ends could be used for a plasma yield, a special device should be applied for cancellation of plasma propagation toward the second end of the tube. For example it could be a special dielectric labyrinth for plasma as it is applied in "Aiplasma" plasma sources (NAIS, Matsushita Electric Works, Ltd.).

For proper operation of the RF CCP source type described above, a voltage for igniting and a voltage for maintenance of the RF discharge plasma inside the tube 1 should be significantly less than the voltage necessary for electric breakdown between the electrodes outside the tube, including breakdown along the tube surface. In the process of operating the RF CCP source shown in FIG. 1, the significant quantity of heat should be evacuated from the electrodes 2, 3 and from the surface of tube 1 to have a proper electrode and tube temperature. To provide this heat evacuation, the electrodes 2, 3 should have a reliable mechanical contact with the surface of tube 1. The reliable contact between the electrodes and the tube surface is desirable also to avoid an RF microarcing between an outside surface of the tube and an inner surface of the electrodes at the area of their contact. However this assumes the electrodes 2, 3, mounted precisely on the surface of tube 1, are exposed in this way to electric surface-breakdown. To overcome this problem, the electrodes 2, 3, could be enveloped in a high-temperature dielectric and sealed from one another as is done in "Aiplasma" plasma sources (NAIS, Matsushita Electric Works, Ltd.).

A principal disadvantage of such a device is limitation in a gas pressure range and in a gas composition capable to provide a stable igniting and maintenance of plasma inside the tube with a reliable absence of electric sparks and breakdowns outside the tube 1. A second disadvantage of this device is a restriction in the active RF power absorbed in the source (300–400 Wt) due to obvious restriction in temperature and breakdown voltage for the insulators enveloping the electrodes. It is clear also, that breakdown voltage for any insulator is decreased with temperature increase, while the cost of such an insulator is increased drastically with an increase of an upper allowable temperature (note for example the material kinds PEEK, PBI and Polyimide). The third disadvantage is the problem of growing expenses for insulating electrodes having a large width, more than 25 cm, and corresponding to a rectangular cross-section of the discharge tubes required for linear plasma sources acceptable for industrial conveyor technologies.

OBJECT OF THE INVENTION

It is an object of the present invention to provide the capacitively coupled RF plasma source of the external ring or collar type with the configuration of an RF loaded line type which is simple in design, inexpensive to manufacture, eliminates dissipation of power in an electromagnetic interference, provides effective transfer of energy from power supply to plasma, provides necessary electric insulation of the electrodes, provides necessary cooling of the electrodes with an operating tube surface, and provides RF power pressure on plasma only toward one of the ends of the operating tube for direct contact of plasma with an surface to be treated. Another object of the invention is to provide an efficient plasma generation at any chosen gas pressure and gas composition flowing in the operating tube, including aggressive mediums.

SUMMARY OF THE INVENTION

An RF loaded line type CCP source is formed as a terminating fragment of a loaded RF line (coaxial line or balanced stripline) including a plasma beam as a part of a line core. The core of a feeding coaxial cable is connected with a high voltage collar type electrode coupled capacitively with a plasma beam electrically continuing this central core, and coupled further capacitively with a collar type electrode extended to form a grounded outer coaxial shield enveloping both electrodes, and a plasma-beam is contained in an insulating tube passing through both collar type electrodes. The grounded shield of the source is connected with the outer braid of the feeding coaxial cable. A gaseous or vapor working medium required for a specific process is fed to the operating tube from the high voltage electrode end under a pressure of from several mTorr to several atmospheric pressures, depending on the process. The plasma beam yields or is discharged from the operating tube at the grounded end under action of the gas flow and an RF field pressure. The power supply operates at a frequency of from 10 MHz to 100 MHz or higher and has a power rating of from tens of W to several kW. To provide a stable plasma excitation at any chosen gas or vapor pressure and composition in the operating tube, an interior cavity is formed between the ring or collar type electrodes with the operating tube and the inner surface of the outer enveloping shield and is filled with a gas or a special gas mixture having a required pressure or with an oil to provide a required electrode insulation against an RF breakdown outside the operating tube, i.e. in the source interior cavity. To form a linear plasma beam required for a large surface treatment, the RF loaded line type CCP source of the coaxial configuration is flattened in a plane passing through the source axis to the geometry of the conventional RF stripline.

BRIEF DESCRIPTION OF THE DRAWINGS

Other objects and advantages appear hereinafter in the following description and claims.

The accompanying drawings show, for the purpose of exemplification, without limiting the scope of the invention or the accompanying claims, certain practical embodiments of the invention, wherein:

DETAILED DESCRIPTION OF THE RF LOADED LINE PLASMA SOURCE OF THE PRESENT INVENTION

Figure 1:
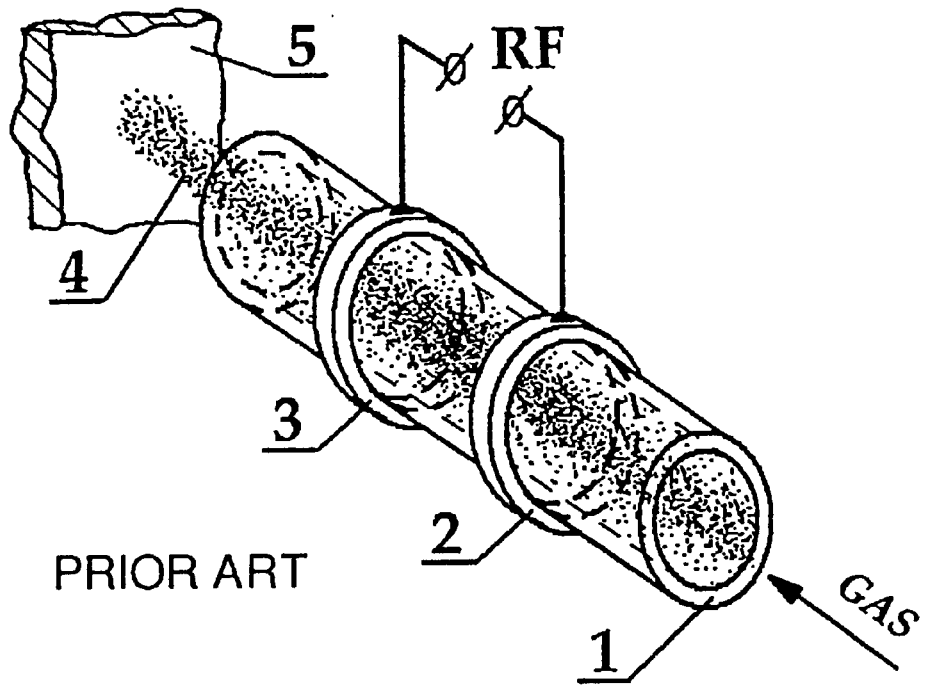
FIG. 1 is a schematic isometric view of a known RF CCP source with ring or collar electrodes outside the insulating wall of an operating tube.
Figure 2:
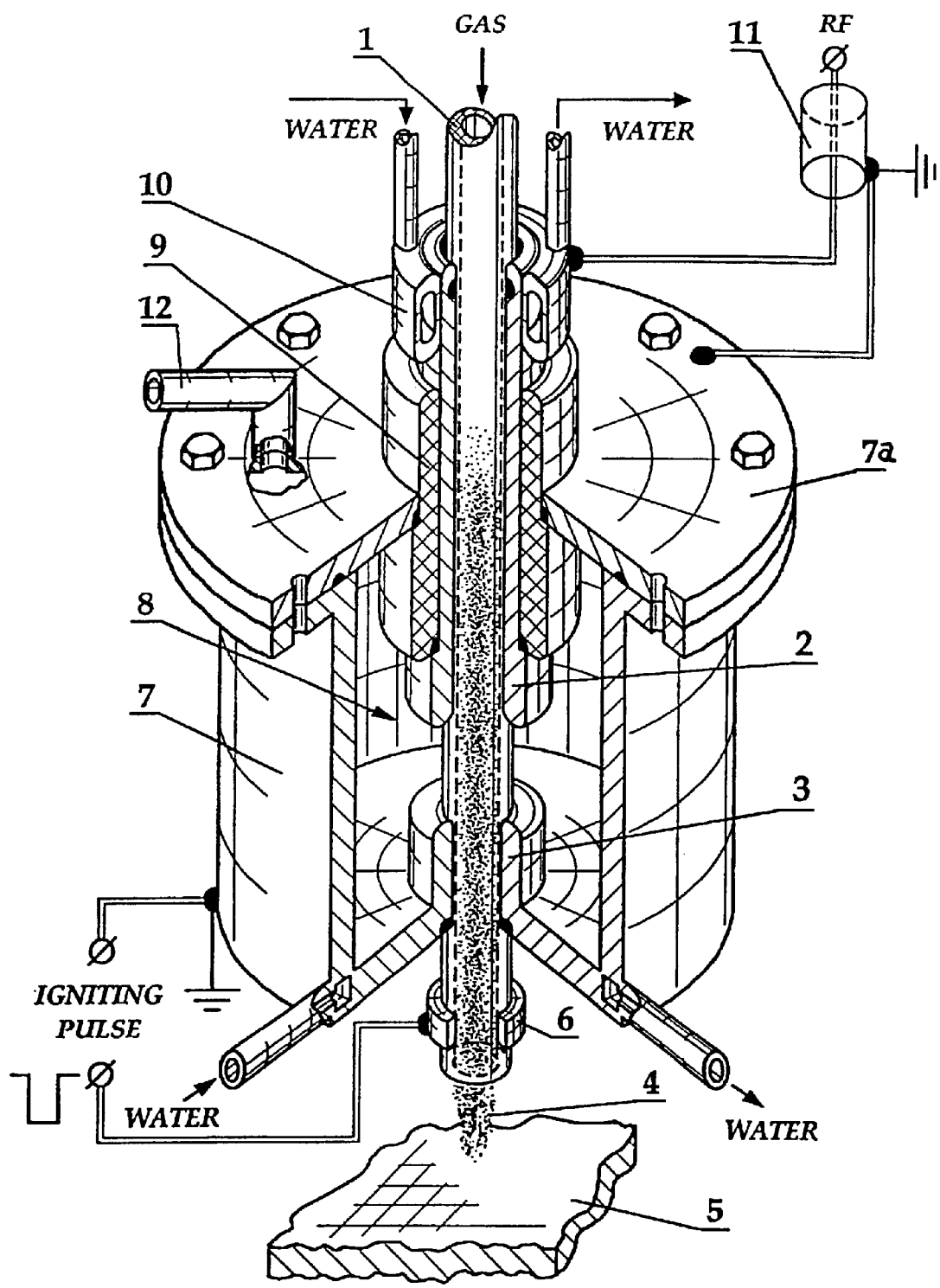
FIG. 2 is a schematic three dimensional isometric sectional view in partial section of a coaxial version of a plasma source of the present invention.

An RF plasma source made according to one embodiment of the present invention is shown in FIG. 2 in a three dimensional sectional view of the device. The device comprises an operating tube 1 of a high temperature insulator (quartz, ceramic) passing throughout a high voltage ring or collar type electrode 2 and further through a collar type electrode 3 extending to form an outside cylindrical shield 7 coaxially enveloping the inner part of the operating tube 1 and the high voltage electrode 2. The outside cylindrical shield 7 is flanged, and the high voltage electrode 2 is mounted on a flange 7a by a cylindrical insulator 9. All the connections of the operating tube 1 with the electrodes 2, 3, the connections of the flange 7a with the cylindrical shield 7 and the insulator 9, as well as the connection of the insulator 9 with the high voltage electrode are sealed by corresponding O-rings shown in FIG. 2 as solid black cross sections. To ignite the device, the special igniting electrode 6 is mounted at the output end of the operating tube 1. An RF power supply is connected with the device by a coaxial cable 11 and further by a water cooled clamp 10 which also provides cooling of the high voltage electrode 2. Cooling of the grounded electrode 3 and the outside cylindrical shield 7 is provided by a water passage or conduit in their common body. A gaseous working medium is supplied via an end of the operating tube 1 from the high voltage electrode 2 side, and plasma 4 generated by RF power applied between the electrodes 2 and 3 yields or discharges from the opposite end of the operating tube with a gas flow as well as by pressure of the RF field in contact with the workpiece 5. The interior cavity 8 formed between the inner surface of the shield 7, the outer surfaces of the electrodes 2, 3 and the operating tube 1, and the inner surface of the flange 7a and the insulator 9, is filled through pipe 12 with a special gas composition under a necessary or prescribed pressure (or with corresponding oil) to prevent RF discharge outside the operating tube, e.g. in the interior cavity 8. It is understood that for any reasonable pressure and a gas (or vapor) composition feeding the RF discharge plasma in the operating tube 1, one can find a suitable medium along with its required pressure for filling interior cavity 8 to prevent direct RF breakdown between the electrodes 2 and 3.

Figure 3:
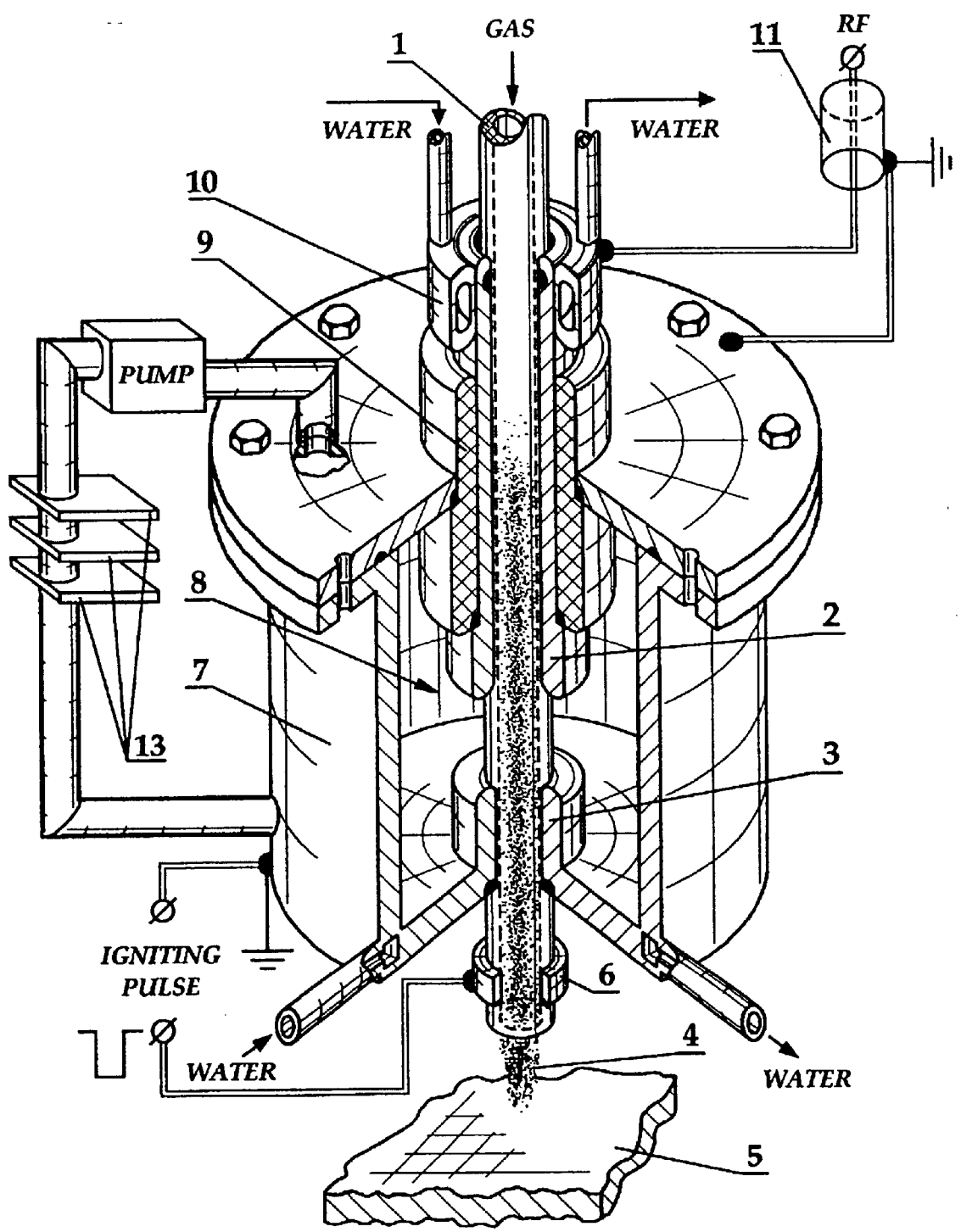
FIG. 3 is a schematic isometric view in partial section of a plasma source of the type shown in FIG. 2 with a closed heat exchanging system for increased power contribution in the operating plasma.

In the embodiment shown in FIG. 2, cooling of the outside surface of the operating tube 1 is carried out only by a natural heat exchange between the tube surface and a medium filling the interior cavity 8. Thus a power contribution in plasma for this embodiment is limited by thermal properties of the operating tube 1 material. In FIG. 3, another version of the plasma source is shown where circulation of the medium filling the interior cavity 8 is provided by pumping of this medium throughout a heat exchanger 13 which extends the power range of the source.

Figure 4:
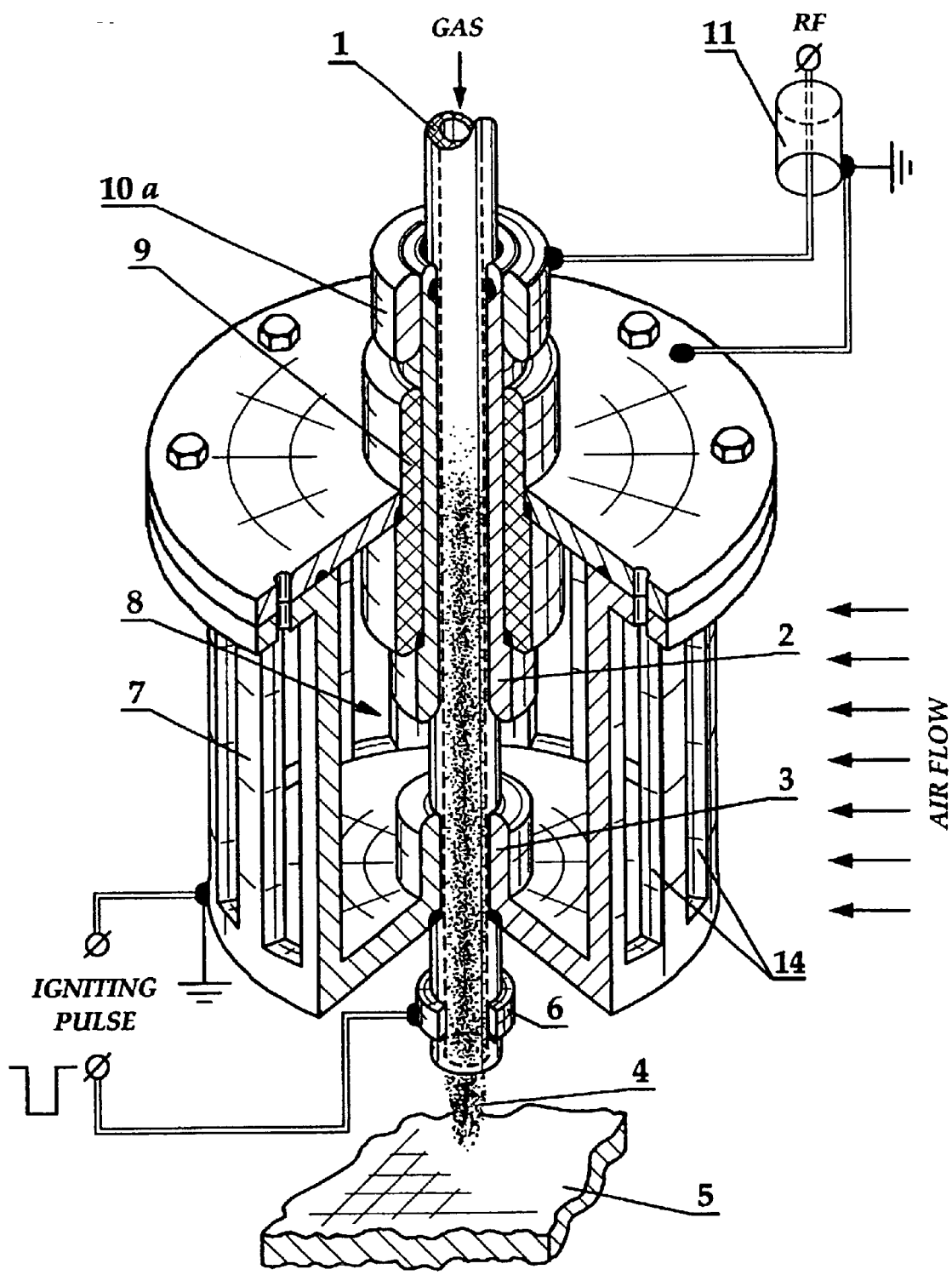
FIG. 4 is a schematic isometric view in partial section of a plasma source of the type shown in FIG. 3 with openings providing air cooling for electrodes and an operating tube for the plasma source.

In FIG. 4, another embodiment of the present invention is shown wherein the outer shield 7 is provided with special openings 14 allowing outside forced air cooling of the electrodes 2, 3 and the operating tube 1. The linear sizes of the openings 14 provided in this-embodiment are significantly less than the wave length of RF power applied to the plasma source to prevent RF power radiation from the source interior cavity 8 throughout these openings. It is understood that the upper limit of the operating gas pressure range for this embodiment is restricted by the atmospheric pressure.

Figure 5:
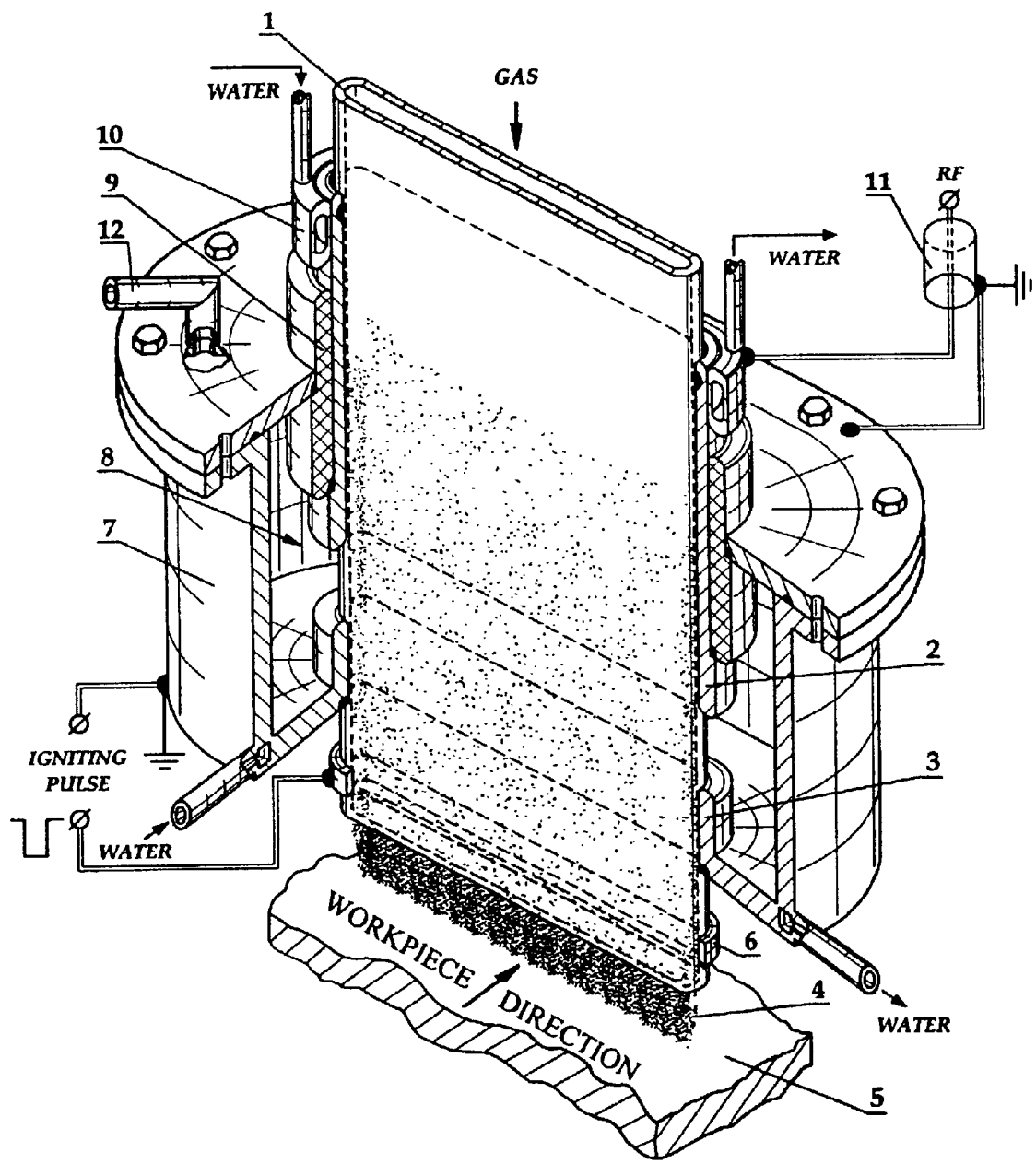
FIG. 5 is a schematic isometric view in partial section of a plasma source of the type shown in FIG. 3 and flattened to form a balanced RF stripline configuration providing a linear plasma beam for large linear sizes of surfaces to be treated.
Figure 6:
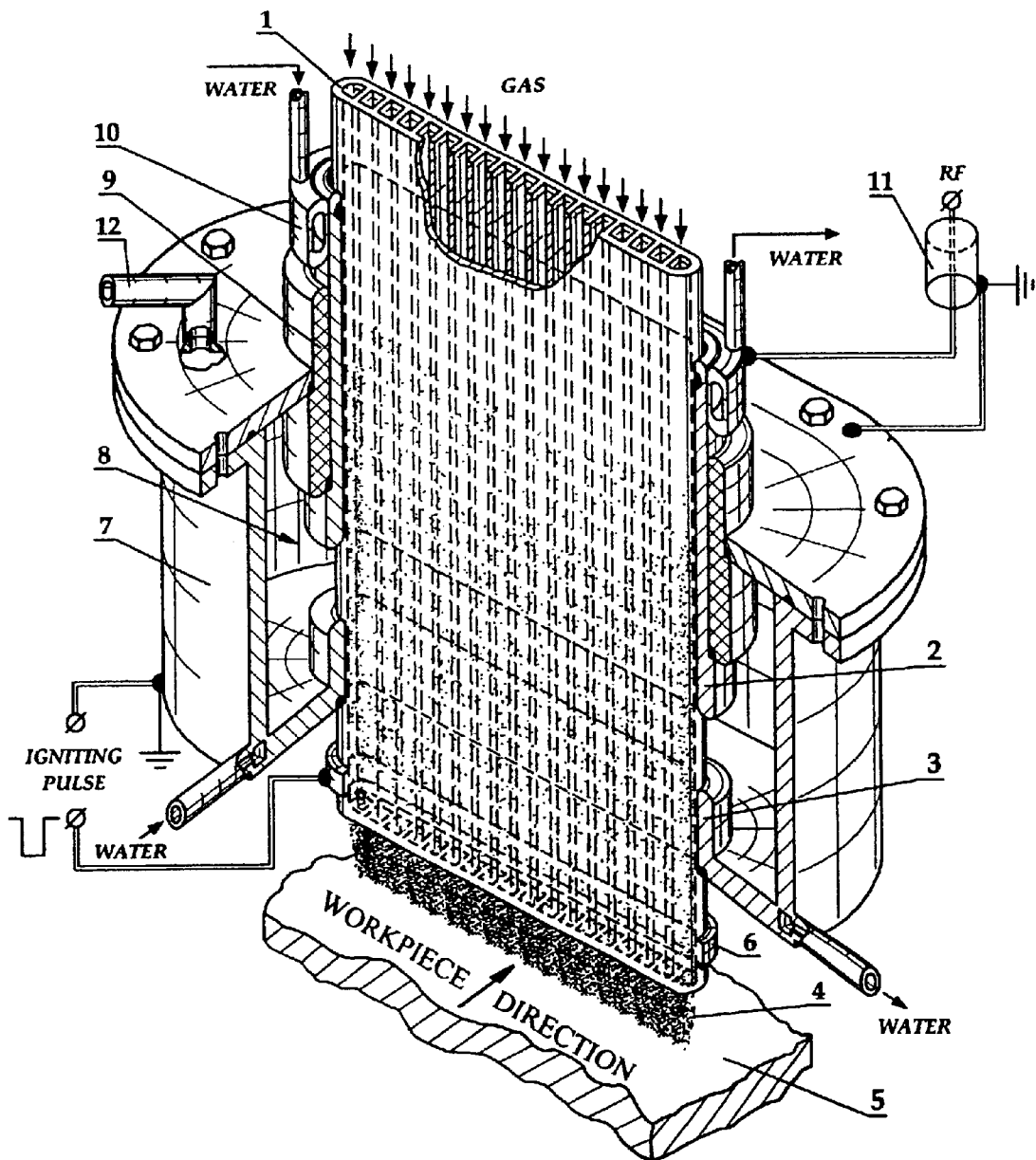
FIG. 6 is a schematic isometric view in partial section of a plasma source of the type shown in FIG. 5 with an operating tube having partitions increasing the tube mechanical strength and improving uniformity of the linear plasma beam produced.
Figure 7:
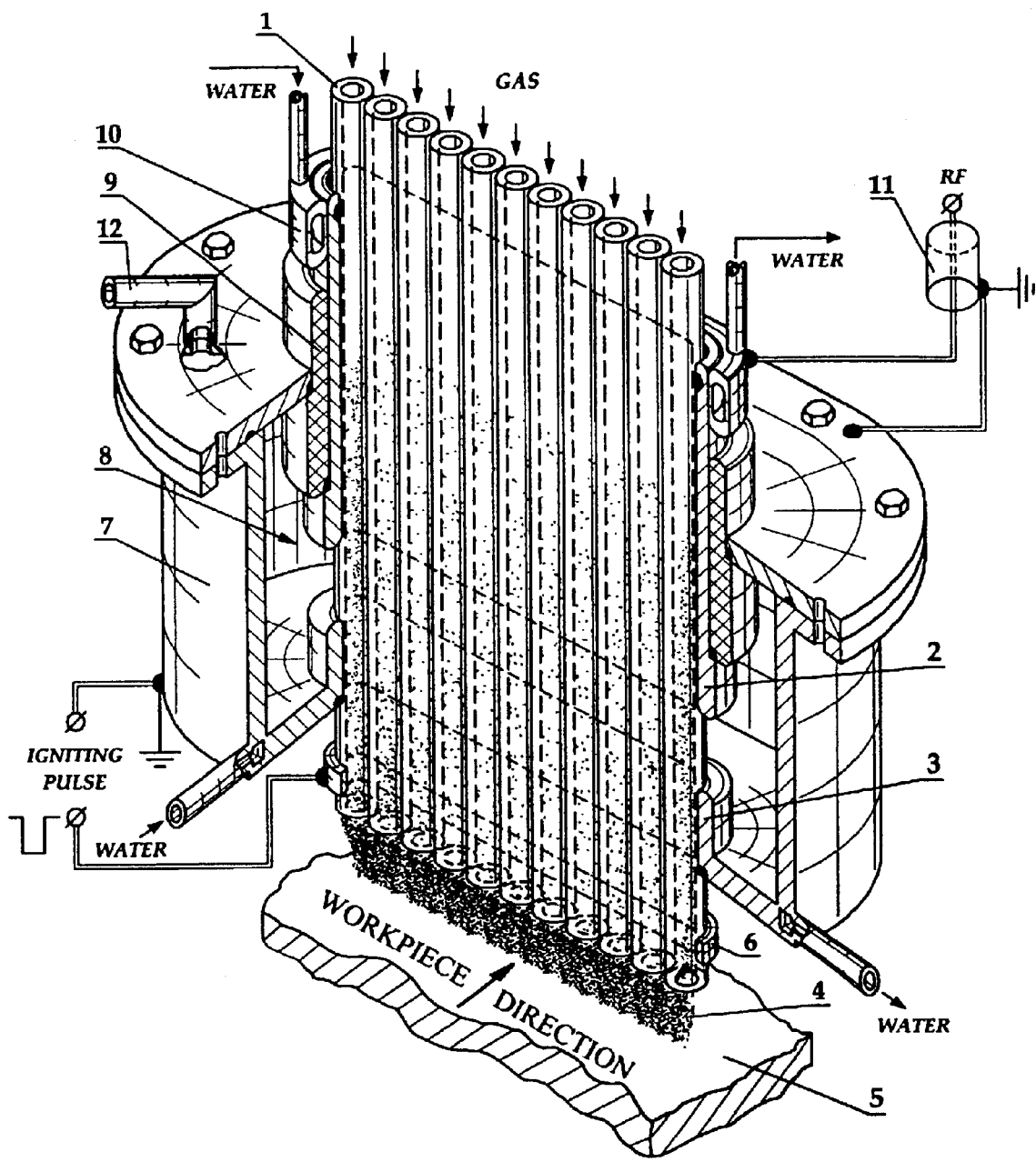
FIG. 7 is a schematic view in partial section of a plasma source of the type shown in FIG. 5 with a series of operating tubes forming a linear array providing simplicity and a low cost arrangement for the linear plasma beam generation.

FIGS. 5, 6, and 7 are three-dimensional cross section views of the present invention with the geometry of its elements flattened in a plane passing through a plasma source symmetry axis to obtain a uniform linear plasma beam required for a large surface area treatment. In FIG. 5, the operating tube 1 shown is shaped by flattening of a conventional round tube. In FIG. 6, the operating tube 1 has a plurality of partitions to provide independent discharge in each separated sub-tube that allows good uniformity of the linear beam at operating gas pressures and compositions, promoting a contraction of RF discharge. The operating tube with the partitions has also a high mechanical strength allowing one to apply a high medium pressure in interior cavity 8 of the plasma source.

In FIG. 7, a linear array of small diameter tubes is shown and provides the simplest way of discharge separation. However uniformity of substrate treatment corresponding to this small diameter tube array embodiment depends on the operating gas composition and other conditions of gas flow and RF discharge. It is understood that configuration of the plasma sources in these flattened shape embodiments corresponds to a conventional stripline load for the RF power supply.

Figure 8:
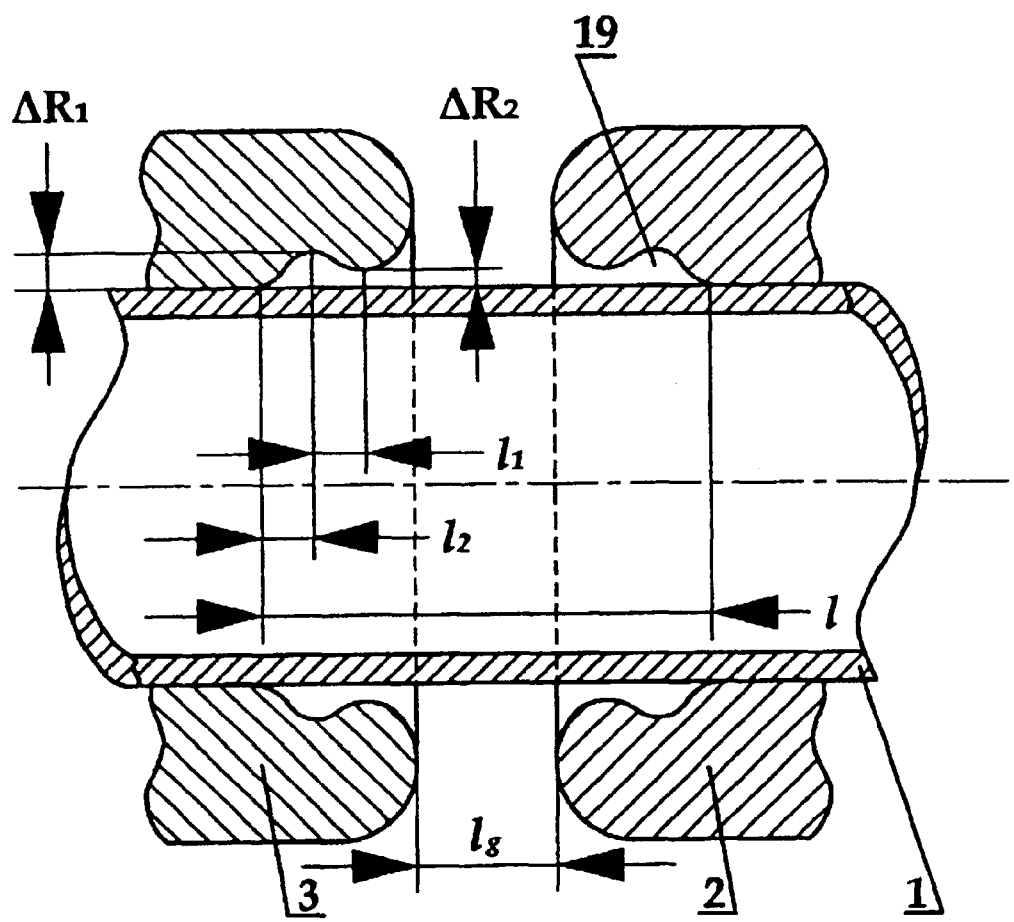
FIG. 8 is a schematic view in vertical cross section showing the geometry of the electrode cross section providing a zero value of the surface electric field strength at the vicinities of the contacts of the tube with the electrodes.

FIG. 8 is a sectional view of the electrode geometry providing a zero value of the electric field strength along the surface of tube 1 at the areas of electrode contact with the tube. The specific feature of this geometry is to form a special space 19 at the certain distance $l_1$ from the electrode edge portion closest to the tube surface. In this manner, the gap $\Delta R_1$ between a tube surface and the surface of the electrode at a distance $l_1$ from the electrode edge portion closest to the tube surface is more than the gap $\Delta R_2$ between the electrode edge portion closest to the tube surface and the tube surface. Therefore the position of the electrode contacts with the tube is shifted from the electrode edge toward an interior of the electrode, and a gas gap $l_g$ between the electrode surfaces facing one another is always less than the gap l between the electrode areas contacting with the tube surface. The geometry of the electrodes shown in FIG. 8 allows avoidance of premature breakdown between the electrodes 1 and 2 along the surface of the operating tube 1.

Figure 9:
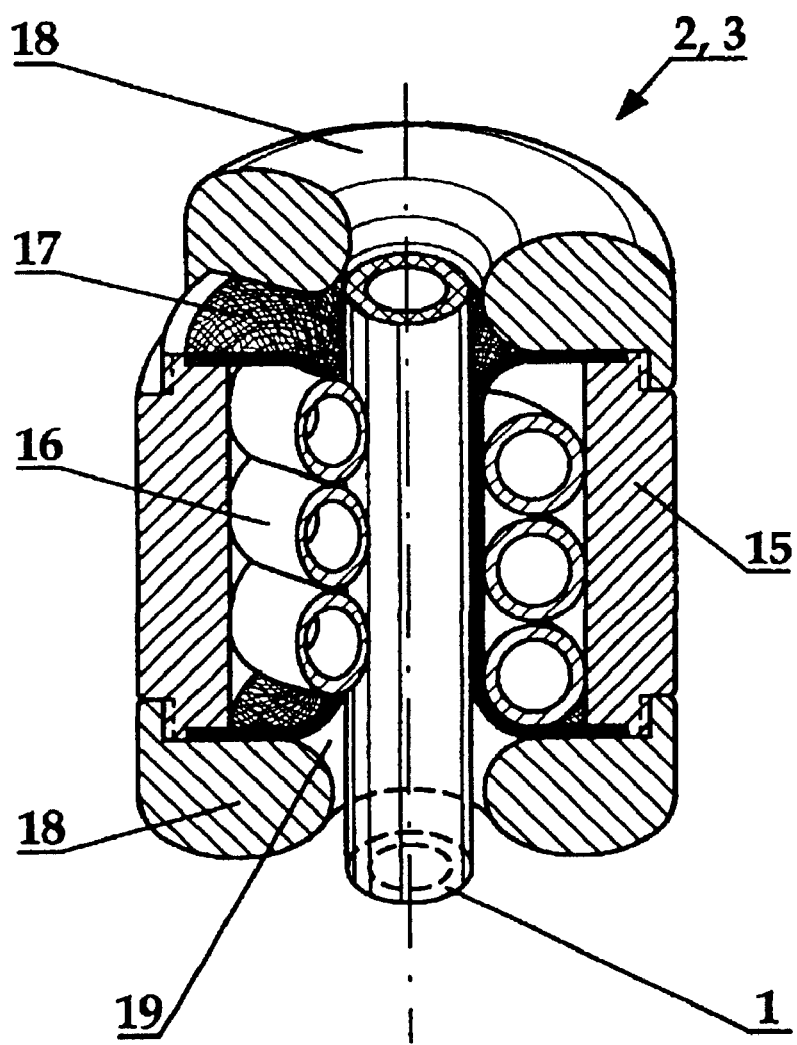
FIG. 9 is a schematic isometric view in partial section of the electrode configuration providing an effective mechanical contact with the surface of the operating tube.

In FIG. 9, a three-dimensional sectional view of one of the electrode embodiments is shown having improved electrical and thermal contact of the electrode with the tube surface to eliminate microarcs between inner surfaces of the electrode and a surface of the operating tube 1, and having improved heat evacuation from the tube surface which is enclosed by the electrode. In this embodiment, a soft metallic (copper) water-cooling pipe 16 is wound tightly around operating tube 1 which is covered preliminary by a soft metallic (silvered-copper) braid 17 compensating for all possible temperature expansions of the operating tube 1 and pipe 16. A cartridge 15 tightly contains the wound pipe 16, and caps 18 fix edges of the braid 17 and form annular gaps or spaces 19 similar to those shown in FIG. 8 which prevent electric breakdown along the surface of operating tube 1.

Thus it has been shown that the invention provides an RF capacitive coupled plasma source configured as terminating portions of a loaded RF line (RF coaxial line or balanced RF stripline) which is simple in construction, completely free of energy loss in electromagnetic interference, capable of generating plasma in any gas (and vapor) composition at any reasonable operating pressure (including aggressive compositions at atmospheric or higher pressure), provides an operation without damage to the structural elements of the source with collateral effects of the RF discharge, provides a uniform linear plasma beam of any necessary length to perform industrial treatment of large substrate surface areas. The plasma source of the invention can be supplied with the industrial standards for the frequencies, for example 13.65 MH.

Although the invention has been shown in the form of specific embodiments, it is understood that these embodiments were given only for purpose of illustration and that changes and modifications are possible, provided they do not depart from the scope of the appended claims. For example, the outer cylindrical shield, electrodes, and operating tube may have cross-sections other than circular or rectangular.

What I claim is:

1. A radio frequency capacitive coupled plasma source comprising:

a high voltage collar type electrode connected to a core of a feeding coaxial cable leading to a power supply;

a grounded collar type electrode spaced from said high voltage collar type electrode and connected to a shield of said coaxial cable;

an operating tube passing through both said collar type electrodes for containing a plasma beam excited by an electric field acting between said collar type electrodes when fed from said power supply;

said grounded collar type electrode extended to provide an outer shield formed to symmetrically envelope said operating tube with said high voltage collar type electrode and arranged to provide a termination for a loaded radio frequency line wherein said high voltage collar type electrode with said plasma beam excited inside said operating tube forms a core of said radio frequency line;

said outer shield forming a housing with an interior cavity between its inner surface and outer surfaces of said high voltage electrode and said operating tube; and means for supplying a gaseous working medium into said operating tube at an end thereof adjacent the high voltage electrode to provide a plasma beam discharge from an opposite end of said operating tube.

2. The plasma source of claim 1 wherein said electrodes, operating tube and shield have a symmetrical circular cylindrical shape.

3. The plasma source of claim 1 wherein said electrodes, operating tube and shield have a flattened cylindrical symmetry.

4. The plasma source of claim 3 wherein said operating tube has partitions dividing an interior of said operating tube to provide a plurality of parallel tubes.

5. The plasma source of claim 3 wherein said operating tube is comprised of an aligned series of parallel tubes.

6. The plasma source of claim 1, wherein said electrodes, operating tube and shield are dimensioned and arranged as said radio frequency line which is impedance matched with an impedance of said feeding coaxial cable.

7. The plasma source of claim 6 wherein said electrodes, operating tube and shield are dimensioned and arranged to provide impedance matching for the excited plasma beam with the impedance of said radio frequency line.

8. The plasma source of claim 1, wherein said outer shield is provided with openings having linear sizes significantly less than the wave length of a radio frequency of said power supply to provide outside forced air cooling ventilation of said housing without any destruction of shielding features of said outer cylindrical shield.

9. The plasma source of claim 1, wherein said outer shield is solid, said interior cavity is closed, sealed, and filled with a high pressure gaseous medium to set a required value of a breakdown voltage between said high voltage and said grounded collar type electrodes.

10. The plasma source of claim 1, wherein said outer shield is solid, said interior cavity is closed, sealed, and filled with a liquid insulating and cooling medium to set a required value of a breakdown voltage between said high voltage and said grounded collar type electrodes and to provide an intensive cooling for said high voltage electrode and said operating tube.

11. The plasma source of claim 10, wherein said interior cavity is connected with an outer circulation conduit for cooling.

12. The plasma source of claim 1, wherein said high voltage and said grounded collar type electrodes have separated cooling conduits provided in said electrodes.

13. The plasma source of claim 1, wherein said high voltage and said grounded collar type electrodes have end portions faced to one another with annular collar spaces between said facing end portions and said tube, said annular collar spaces being greater in radial cross section at intermediate portions thereof between said facing end portions and terminating interior portions where the electrodes engage said tube for decreasing the probability of an electric breakdown along said operating tube surface between said electrodes.

14. The plasma source of claim 13, wherein said high voltage and said grounded collar type electrodes comprise a soft conductive water cooling pipe wound tightly around said operating tube which is dressed preliminarily with a soft metallic braid, and said wound water cooling pipe is housed in a cylindrical cartridge having two end caps securing edges of said braid with said cartridge and thereby also forming said annular spaces.

* * * * *